(12) United States Patent
Karda et al.

(10) Patent No.: US 11,843,055 B2
(45) Date of Patent: Dec. 12, 2023

(54) SEMICONDUCTOR DEVICES COMPRISING TRANSISTORS HAVING INCREASED THRESHOLD VOLTAGE AND RELATED METHODS AND SYSTEMS

(71) Applicant: Micron Technology, Inc., Boise, ID (US)

(72) Inventors: Kamal M. Karda, Boise, ID (US); Kirk D. Prall, Boise, ID (US); Haitao Liu, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 123 days.

(21) Appl. No.: 16/596,339

(22) Filed: Oct. 8, 2019

(65) Prior Publication Data

US 2020/0111918 A1 Apr. 9, 2020

Related U.S. Application Data

(60) Provisional application No. 62/743,059, filed on Oct. 9, 2018.

(51) Int. Cl.
*H01L 29/786* (2006.01)
*H01L 29/423* (2006.01)
(Continued)

(52) U.S. Cl.
CPC ...... *H01L 29/78642* (2013.01); *G11C 11/409* (2013.01); *H01L 29/42384* (2013.01);
(Continued)

(58) Field of Classification Search
CPC ......... H01L 29/78642; H01L 29/42384; H01L 29/7869; H01L 29/0676; H01L 29/7827;
(Continued)

(56) References Cited

U.S. PATENT DOCUMENTS 5,103,276 A * 4/1992 Shen ................... H10B 12/395
257/302
5,804,848 A * 9/1998 Mukai ................ H01L 29/7831
257/E29.264
(Continued)

FOREIGN PATENT DOCUMENTS

KR  10-2009-0054686 A  6/2009
KR  10-1368191 B1  2/2014
(Continued)

OTHER PUBLICATIONS

International Search Report from International Application No. PCT/US2019/054838, dated Jan. 23, 2020, 3 pages.
(Continued)

*Primary Examiner* — Jesse Y Miyoshi
(74) *Attorney, Agent, or Firm* — TraskBritt

(57) ABSTRACT

A transistor comprising threshold voltage control gates. The transistor also comprises active control gates adjacent opposing first sides of a channel region, the threshold voltage control gates adjacent opposing second sides of the channel region, and a dielectric region between the threshold voltage control gates and the channel region and between the active control gates and the channel region. A semiconductor device comprising memory cells comprising the transistor is also disclosed, as are systems comprising the memory cells, methods of forming the semiconductor device, and methods of operating a semiconductor device.

18 Claims, 6 Drawing Sheets

(51) Int. Cl.
  *H01L 29/66* (2006.01)
  *H10B 12/00* (2023.01)
  *G11C 11/409* (2006.01)

(52) U.S. Cl.
  CPC .... *H01L 29/66969* (2013.01); *H01L 29/7869* (2013.01); *H10B 12/05* (2023.02); *H10B 12/30* (2023.02); *H10B 12/50* (2023.02)

(58) Field of Classification Search
  CPC ......... H01L 29/78645; H01L 29/78648; H01L 27/10841; H01L 27/10864; G11C 11/409; G11C 2213/79; G11C 16/0433; G11C 11/404; H10B 12/395; H10B 12/0383
  See application file for complete search history.

(56) References Cited

U.S. PATENT DOCUMENTS

| | | | |
|---|---|---|---|
| 6,908,828 | B2 | 6/2005 | Letertre et al. |
| 8,431,961 | B2 | 4/2013 | Liu et al. |
| 8,742,481 | B2 | 6/2014 | Tessariol et al. |
| 8,921,891 | B2 | 12/2014 | Liu et al. |
| 9,478,550 | B2 | 10/2016 | Karda et al. |
| 9,577,092 | B2 | 2/2017 | Karda et al. |
| 9,761,599 | B2 | 9/2017 | Liu et al. |
| 9,941,298 | B2 | 4/2018 | Huang et al. |
| 10,665,694 | B2 * | 5/2020 | Cheng ............... H01L 29/42376 |
| 10,672,888 | B2 * | 6/2020 | Cheng ............... H01L 29/42376 |
| 2001/0030323 | A1 * | 10/2001 | Ikeda ................ H01L 29/78648 438/149 |
| 2010/0066440 | A1 | 3/2010 | Juengling |
| 2011/0068418 | A1 | 3/2011 | Lung |
| 2011/0073925 | A1 * | 3/2011 | Park .................. H01L 27/10885 257/306 |
| 2011/0298553 | A1 | 12/2011 | Ionescu et al. |
| 2012/0153371 | A1 | 6/2012 | Chen et al. |
| 2016/0260775 | A1 | 9/2016 | Takaki |
| 2017/0365614 | A1 | 12/2017 | Tang et al. |

FOREIGN PATENT DOCUMENTS

| | | |
|---|---|---|
| TW | 201601317 A | 1/2016 |
| TW | 201727831 A | 8/2017 |

OTHER PUBLICATIONS

International Written Opinion from International Application No. PCT/US2019/054838, dated Jan. 23, 2020, 7 pages.
Taiwan Office Action and Search Report for Application No. 108136372, dated Jul. 1, 2020, 9 pages.

* cited by examiner

SEMICONDUCTOR DEVICES COMPRISING TRANSISTORS HAVING INCREASED THRESHOLD VOLTAGE AND RELATED METHODS AND SYSTEMS

CROSS-REFERENCE TO RELATED APPLICATION

This application claims the benefit under 35 U.S.C. § 119(e) of U.S. Provisional Patent Application Ser. No. 62/743,059, filed Oct. 9, 2018, the disclosure of which is hereby incorporated herein in its entirety by this reference.

TECHNICAL FIELD

Embodiments disclosed herein relate to semiconductor devices, such as transistors, and fabrication of the semiconductor devices. More particularly, embodiments of the disclosure relate to transistors, semiconductor devices including the transistors and having an improved threshold voltage ($V_t$), systems incorporating such semiconductor devices, methods of forming the semiconductor devices, and methods of controlling the $V_t$ of the semiconductor devices.

BACKGROUND

Transistors are utilized in a variety of semiconductor devices. The transistors may include a channel region between a pair of source/drain regions and one or more gates configured to electrically connect the source/drain regions to one another through the channel region. A gate dielectric material separates the gates from the channel region. The channel region is usually formed of a uniform semiconductor material, such as silicon. However, other materials with high electron mobilities and high band gaps have also been used, such as polysilicon or an amorphous oxide semiconductor material.

The transistors used in volatile memory cells, such as dynamic random access memory (DRAM) cells, may be coupled to a storage element. The storage element may, for example, include a capacitor (e.g., sometimes referred to as a "cell capacitor" or a "storage capacitor") configured to store a logical state (e.g., a binary value of either 0 or 1) defined by the storage charge in the capacitor. To charge, discharge, read, or recharge the capacitor, the transistor is selectively turned to an "on" state, in which current (referred to as $I_{on}$) flows between the source and drain regions through the channel region of the transistor. The transistor is selectively turned on by applying a gate voltage above the transistor's threshold voltage ($V_t$), which is the minimum gate-to-source voltage needed to create a conductive path/channel between the source and drain regions. The transistor is selectively turned to an "off" state, in which the flow of current (referred to as $I_{off}$) is substantially halted by applying a gate voltage below the transistor's $V_t$. Ideally, in the off state, the capacitor would retain, without change, its charge. However, capacitors of conventional volatile memory cells experience discharges of current over time. Therefore, even in the "off" state, a conventional volatile memory cell will often still undergo some flow of current from the capacitor.

Ideally, a transistor exhibits a high $V_t$, a low $I_{off}$, and a high $I_{on}$. Various parameters influence these electrical characteristics, such as materials used for the source region, drain region, channel region, gate dielectric, etc.; thickness of the gate dielectric material; configuration of the source region, drain region, and channel region; work function of the gates; operation temperature; etc. Achieving a desirable balance of the electrical characteristics requires balancing the parameters. For example, changing the channel material may achieve a lower $I_{off}$. However, the material change may result in a low $V_t$ and require a large negative voltage to turn off the transistor. To increase the $V_t$ of the transistor, a work function difference between the material used for the gates and the material of the channel region may be modified. If, for example, the channel region is formed from polysilicon, the $V_t$ may be increased by doping the polysilicon. However, with other channel materials that cannot be effectively doped, doping cannot be used to change the $V_t$. Therefore, alternative ways of affecting the $V_t$ are desired.

DETAILED DESCRIPTION

A transistor, such as a vertical thin film transistor (TFT), comprising threshold voltage control gates is disclosed, as are semiconductor devices including the transistors and systems incorporating the semiconductor devices. The threshold voltage control gates enable the threshold voltage ($V_t$) of a semiconductor device containing at least one vertical TFT to be tailored. The $V_t$ of the vertical TFT is controlled by applying an external bias to the threshold voltage control gates during use and operation of the semiconductor device containing the vertical TFT. By adjusting the external bias applied to the threshold voltage control gates, a desired $V_t$ of the semiconductor device is achieved. Therefore, the threshold voltage control gates enable electrical characteristics of the semiconductor device to be controlled. Methods of tailoring the $V_t$ of the semiconductor device are disclosed, as are methods of forming the semiconductor device including the vertical TFT. The semiconductor device including the vertical TFT exhibits a high $V_t$, a low $I_{off}$, a high $I_{on}$, and improved word line resistance. The high $V_t$ is achieved without sacrificing an effective channel area of the vertical TFT for $I_{on}$ and the low Tar enables improved refresh and disturb properties.

Figure 1:
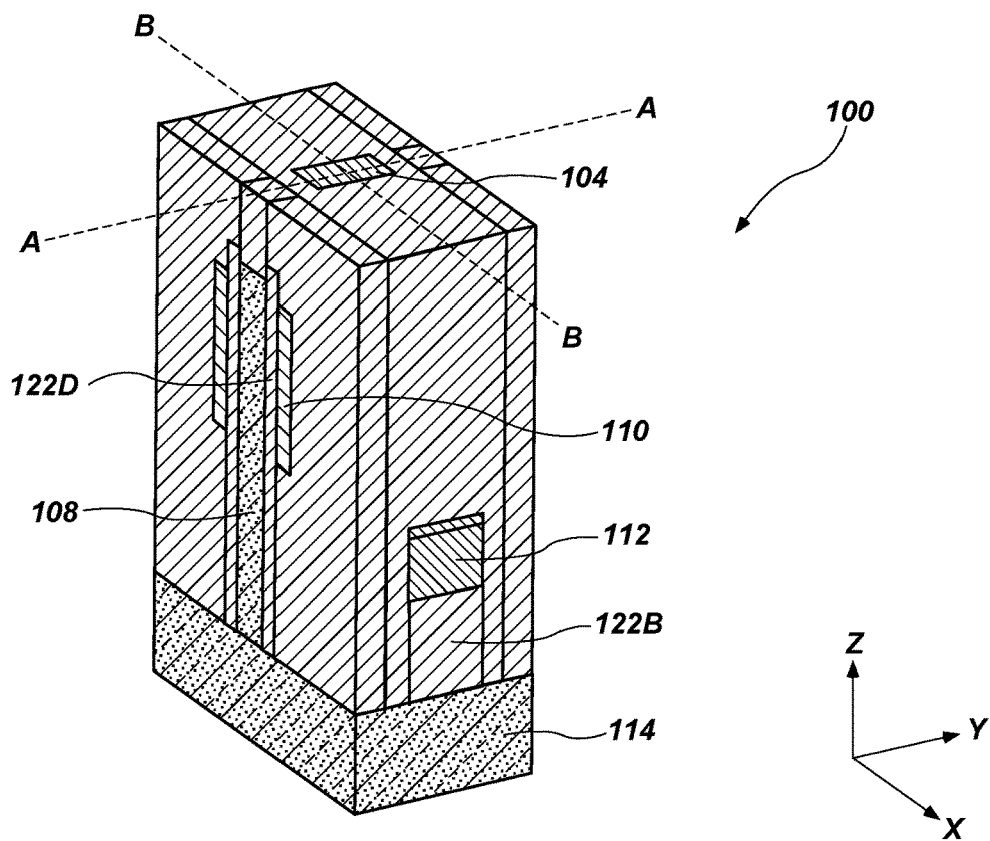
FIGS. 1 and 1A are simplified cutaway perspective views of a transistor in accordance with embodiments of the disclosure.
Figure 1A:
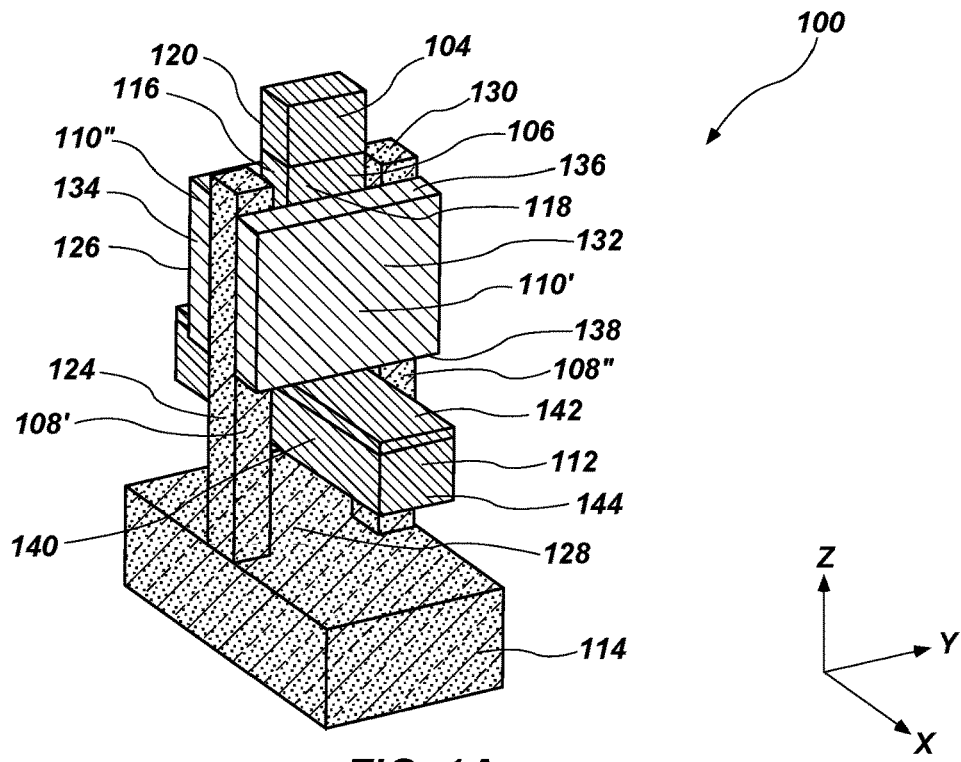

A vertical TFT 100 according to embodiments of the disclosure includes a source region 102, a drain region 104, a channel region 106 (e.g., body), threshold voltage control gates 108, active control gates 110, a digit line 112, and a source 114, as shown in one or more of FIGS. 1, 1A, 1B, and 1C. The components of the vertical TFT 100 are formed on a substrate (not shown). The source region 102, drain region 104, and channel region 106 may extend substantially vertically from the substrate, and the digit line 112 and source 114 may extend substantially parallel to the substrate. The threshold voltage control gates 108 and active control gates 110 are oriented perpendicular relative to one another and, in combination, substantially surround the channel region 106. The threshold voltage control gates 108 are laterally adjacent to sidewalls 116 of the channel region 106 and are configured to tailor the $V_t$ of the vertical TFT 100. The active control gates 110 are laterally adjacent to a front surface 118 and back surface 120 of the channel region 106 and may be oriented substantially perpendicular to the digit line 112. The active control gates 110 are adjacent opposing first sides of the channel region 106. The threshold voltage control gates 108 are adjacent opposing second sides of the channel region 106. The active control gates 110 are configured to electrically connect the source region 102 and the drain region 104 to one another through the channel region 106. A length of the threshold voltage control gates 108 is greater than a length of the channel region 106 and a length of the active control gates 110 is less than the length of the channel region 106. The threshold voltage control gates 108 and active control gates 110 are separated from the channel region 106 and from one another by one or more dielectric materials (e.g., one or more dielectric regions) of the dielectrics 122, e.g., gate dielectrics. The dielectrics 122 also isolate other components of the vertical TFT 100 and isolate adjacent vertical TFTs 100 from one another. FIG. 1A depicts the vertical TFT 100 of FIG. 1 with the dielectric 122 removed to more clearly illustrate the other components.

The vertical TFT 100 according to embodiments of the disclosure differs from a conventional vertical TFT by the presence of the threshold voltage control gates 108, which are located in place of (i.e., replace) a portion of the dielectric material in a conventional vertical TFT. Although, however, the vertical TFT 100 according to embodiments of the disclosure includes the threshold voltage control gates 108, the footprint of the semiconductor device including the vertical TFT 100 is substantially the same as that of a semiconductor device including the conventional vertical TFT and lacking the threshold voltage control gates 108.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device or a complete process flow for manufacturing the semiconductor device and the structures described below do not form a complete semiconductor device. Only those process acts and structures necessary to understand the embodiments described herein are described in detail below. Additional acts to form a complete semiconductor device may be performed by conventional techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "active control gates" means and includes a pair of gates adjacent to the channel region and configured to cause a drive current to flow through the channel region coupled between the source region and the drain region upon application of a gate voltage above the $V_t$.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "semiconductor device" includes without limitation a memory device, as well as other semiconductor devices which may or may not incorporate memory, such as a logic device, a processor device, or a radiofrequency (RF) device. Further, a semiconductor device may incorporate memory in addition to other functions such as, for example, a so-called "system on a chip" (SoC) including a processor and memory, or a semiconductor device including logic and memory.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOT") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the term "threshold voltage control gates" means and includes a pair of gates adjacent to the channel region and through which an external bias is applied to affect the $V_t$ of the vertical TFT.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

The source region 102 is formed of a source material, such as an N-doped or P-doped semiconductor material. The source region 102 may be electrically coupled to a conductive material, such as the digit line 112. The drain region 104 is formed of a drain material, such as an N-doped or P-doped semiconductor material. The drain region 104 may be electrically coupled to a conductive material, such as a contact (not shown).

The channel region 106 of the vertical TFT 100 is formed of a channel material and is operably coupled with the source region 102 and the drain region 104. The channel material of the channel region 106 extends between the source region 102 and the drain region 104. The channel material may be a material that exhibits an electron mobility of from about 0.1 cm$^2$/(V·s) to about 5000 cm$^2$/(V·s), and a room temperature band gap of at least about 1.40 eV, such as about 3.3 eV. The channel material may include, but is not limited to, an oxide semiconductor material, polysilicon, or silicon. Non-limiting examples of the oxide semiconductor material include, but are not limited to, zinc oxide ($Z_nO_x$), indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$) (IGZO, also referred to as gallium indium zinc oxide (IGZO), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and other similar materials, where x, y, z, a, and d are integers or real numbers. The oxide semiconductor material may be a stoichiometric or non-stoichiometric material. In some embodiments, the channel material is the oxide semiconductor material.

The threshold voltage control gates 108 may be formed of an electrically conductive material, such as a metal (e.g., tungsten, titanium, nickel, platinum, ruthenium, aluminum, copper, molybdenum, gold), a metal-containing material (e.g., a metal nitride, a metal carbide, a metal silicide, a metal oxide), a conductively doped semiconductor material (e.g., conductively doped silicon, conductively doped germanium, conductively doped silicon germanium), polysilicon, doped polysilicon, or combinations thereof. The material of the threshold voltage control gates 108 may be selected to exhibit a work function of between about 3.8 eV and about 5.2 eV. In some embodiments, the threshold voltage control gates 108 are formed of a n+ doped polysilicon or a p+ doped polysilicon. The threshold voltage control gates 108 may be formed at a thickness ranging from about 2 nm to about 20 nm. The threshold voltage control gates 108 may be configured to be biased to a predetermined voltage when the active control gates 110 are selected (i.e., biased with a voltage).

The active control gates 110 may be formed of an electrically conductive material including, but not limited to, a metal (e.g., tungsten, titanium, nickel, platinum, ruthenium, aluminum, copper, molybdenum, gold), a metal-containing material (e.g., a metal nitride, a metal carbide, a metal silicide, a metal oxide), a conductively doped semiconductor material (e.g., conductively doped silicon, conductively doped germanium, conductively doped silicon germanium), polysilicon, doped polysilicon, or combinations thereof. In some embodiments, the conductive material is tungsten, titanium, tungsten nitride, or titanium nitride. The active control gates 110 may be configured as an access line (e.g., a word line) arranged perpendicular to the digit line 112, which may be configured as a data/sense line (e.g., a bit line). The work function of the active control gates 110 may range between about 3.8 eV and about 5.2 eV. The active control gates selectively turn the vertical TFT 100 between the "on" and "off" states and is operated conventionally.

The digit line 112 may be formed of an electrically conductive material including, but not limited to, a metal (e.g., tungsten, titanium, nickel, platinum, ruthenium, aluminum, copper, molybdenum, gold), a metal-containing material (e.g., a metal nitride, a metal carbide, a metal silicide, a metal oxide), a conductively doped semiconductor material (e.g., conductively doped silicon, conductively doped germanium, conductively doped silicon germanium), polysilicon, or combinations thereof. In some embodiments, the digit line 112 is formed of a single (e.g., one) electrically conductive material. In other embodiments, the digit line 112 is formed of two or more electrically conductive materials, such as two or more metals, as a composite structure, with each metal providing a different resistance to the digit line 112. The composite structure is indicated in FIGS. 1-1C by a multilayered (e.g., two layers) digit line 112. However, the digit line 112 may include only a single electrically conductive material. The digit line 112 is in electrical communication with the channel region 106.

The source 114 may be formed of an electrically conductive material, such as a doped polysilicon, a metal, or combinations thereof. In some embodiments, the conductive material of the source 114 includes p+ polysilicon or p+ polysilicon in combination with a metal. The work function of the source 114 may range between about 3.8 eV and about 5.2 eV. The work function of the source 114 and the work function of the threshold voltage control gates 108 may be independently selected to achieve the desired $V_t$ of the vertical TFT 100. The source 114 is shared between adjacent vertical TFTs 100, reducing the complexity of the fabrication process. Since the semiconductor device includes multiple vertical TFTs 100, each having the same external bias applied thereto and exhibiting the same $V_t$, the source 114 functions as a contact to the threshold voltage control gates 108, enabling a single contact to be formed rather than forming a separate contact for each of the vertical TFTs 100.

The dielectric 122 may be one or more electrically insulative materials, such as, for example, phosphosilicate glass, borosilicate glass, borophosphosilicate glass (BPSG), fluorosilicate glass, a silicon oxide (e.g., silicon dioxide), a high-K oxide (e.g., titanium dioxide, zirconium dioxide, hafnium dioxide, tantalum oxide, magnesium oxide, aluminum oxide, niobium oxide, molybdenum oxide, strontium oxide, barium oxide, yttrium oxide), a nitride material (e.g., silicon nitride ($Si_3N_4$)), an oxynitride (e.g., silicon oxynitride), another dielectric material, a dielectric carbon nitride material (e.g., silicon carbon nitride (SiCN)), a dielectric carboxynitride material (e.g., silicon carboxynitride (SiOCN)), another material, or combinations thereof. In some embodiments, the dielectric material is silicon dioxide.

The dielectric 122 may substantially surround the channel region 106 and some surfaces of the threshold voltage control gates 108, the active control gates 110, and the digit line 112. As shown in the perspective of FIGS. 1 and 1A, external sidewalls 124 of the threshold voltage control gates 108 and external sidewalls 126 of the active control gates 110 lack the dielectric 122, while internal sidewalls 128 and upper surfaces 130 of the threshold voltage control gates 108 have the dielectric 122, front surfaces 132, back surfaces 134, upper surfaces 136, and lower surfaces 138 of the active control gates 110 have the dielectric 122, and sidewalls 140, upper surfaces 142, and lower surfaces 144 of the digit line 112 have the dielectric 122.

The threshold voltage control gates 108 are separated from the channel region 106 by a first dielectric material 122A (see FIG. 1B), the source 114 is separated from the channel region 106 by a second dielectric material 122B (see FIGS. 1B and 1C), the active control gates 110 are separated from the channel region 106 by a third dielectric material 122C (see FIG. 1C), and the threshold voltage control gates 108 are separated from the active control gates 110 by a fourth dielectric material 122D (FIG. 1). The first dielectric material 122A may be the only material positioned between the threshold voltage control gates 108 and the channel region 106. In other words, one surface of the first dielectric material 122A is in direct contact with the threshold voltage control gates 108 and an opposing surface of the first dielectric material 122A is in direct contact with the channel region 106. The dielectric 122 separating the various components from one another may be the same or different and may be independently selected. Dielectric regions of the dielectric 122 may include the same material or one or more different materials. In some embodiments, each of the dielectrics 122A-122D is the same. In other embodiments, one or more of the dielectric 122A-122D is different.

The thickness of the dielectric 122 may be selected depending on the desired electrical characteristics of the vertical TFT 100 and the thickness of each of the dielectrics 122 is independently selected. For instance, by appropriately selecting the thicknesses of the dielectric 122 between the threshold voltage control gates 108 and the channel region 106, the extent of coupling between the threshold voltage control gates 108 and the channel region 106 may be tailored. By way of example only, the thickness of the third dielectric material 122C between the channel region 106 and the active control gates 110 may be in the range from about 20 Å to about 100 Å, such as between about 20 Å and about 40 Å, between about 40 Å and about 60 Å, between about 60 Å and about 80 Å, or between about 80 Å and about 100 Å. The thickness of the dielectric material 122B between the source 114 and the channel region 106 may be in the range from about 20 Å to about 100 Å, such as between about 20 Å and about 40 Å, between about 40 Å and about 60 Å, between about 60 Å and about 80 Å, or between about 80 Å and about 100 Å. The thickness of each of the dielectric materials may be independently selected depending on the desired $V_t$ of the vertical TFT 100.

Figure 1B:
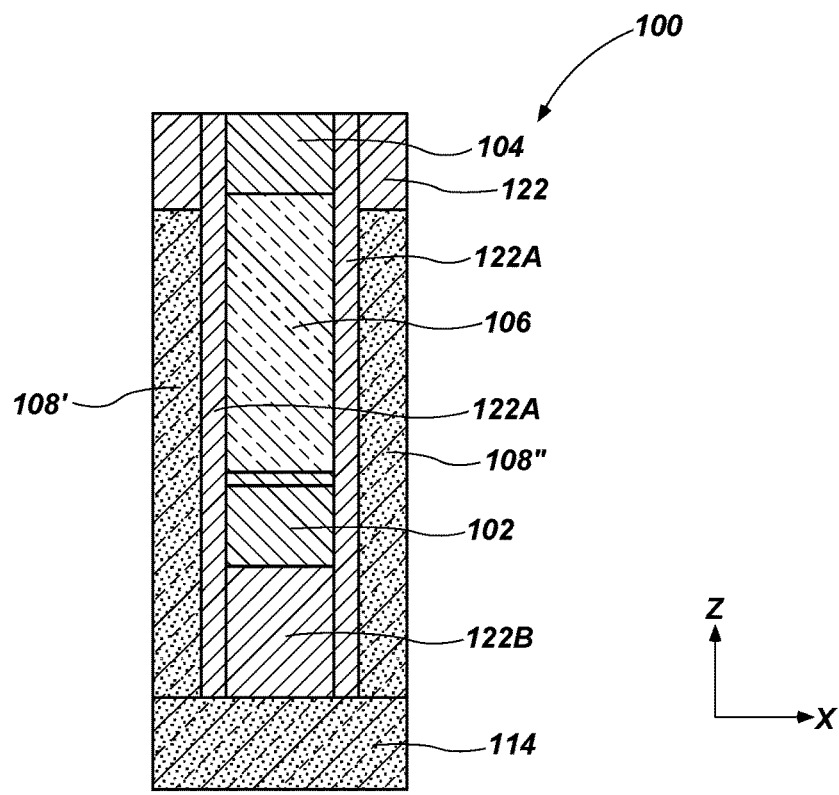
FIG. 1B is a cross-sectional view of the transistor taken along section line A-A of FIG. 1A.
Figure 1C:
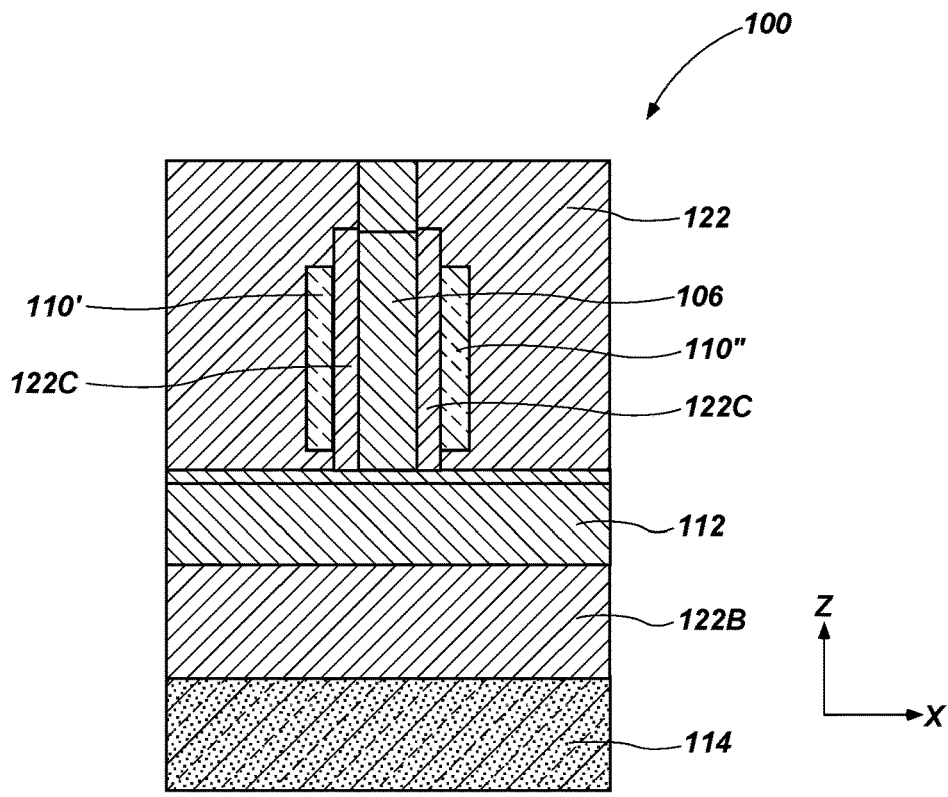
FIG. 1C is a cross-sectional view of the transistor taken along section line B-B of FIG. 1A.

As shown most clearly in FIGS. 1A and 1B, the vertical TFTs 100 according to embodiments of the disclosure include a pair of threshold voltage control gates 108 located laterally adjacent the channel region 106 and separated from the channel region 106 by the first dielectric material 122A. The vertical TFTs 100 according to embodiments of the disclosure differs from conventional vertical TFTs in which only a dielectric material would be present in a similar position. In the perspective of FIG. 1B, the vertical TFT 100 includes, from left to right, a first threshold voltage control gate 108', the first dielectric material 122A, the channel region 106, the first dielectric material 122A, and a second threshold voltage control gate 108". As shown in FIG. 1C, the vertical TFTs 100 according to embodiments of the disclosure include a pair of active control gates 110 located laterally adjacent the channel region 106 and separated from the channel region 106 by the third dielectric material 122C. In the perspective of FIG. 1C, the vertical TFT 100 includes, from left to right, a first active control gate 110', the third dielectric material 122C, the channel region 106, the third dielectric material 122C, and a second active control gate 110".

While FIGS. 1A-1C illustrate a single vertical TFT 100, multiple vertical TFTs 100 are present in the semiconductor device and are arranged in rows (e.g., extending in the x-direction) and columns (e.g., extending in the y-direction). In some embodiments, the rows may be substantially perpendicular to the columns. The semiconductor device includes an array of the vertical TFTs 100 where adjacent vertical TFTs 100 are connected to a single source 114. The threshold voltage control gates 108 separate adjacent vertical TFTs 100 from one another. In addition, the threshold voltage control gates 108 are shared between adjacent vertical TFTs 100.

Accordingly, a transistor comprising a channel region, active control gates, threshold voltage control gates, and a dielectric region is disclosed. The active control gates are adjacent opposing first sides of the channel region and the threshold voltage control gates are adjacent opposing second sides of the channel region. The dielectric region is between the threshold voltage control gates and the channel region and between the active control gates and the channel region.

Figure 2:
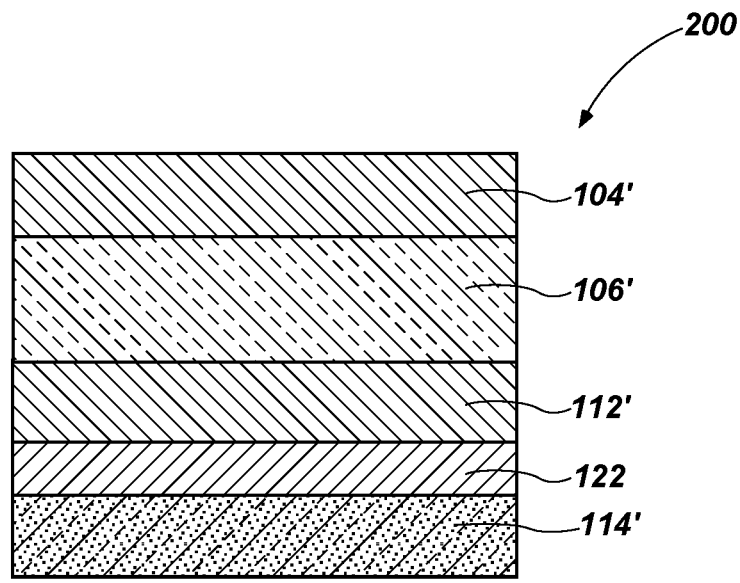
FIGS. 2-6 are cross-sectional views of the transistor during various stages of fabrication in accordance with embodiments of the disclosure.

Fabrication of the vertical TFT 100 having the perspective in FIG. 1B is illustrated in FIGS. 2-6. To form the vertical TFT 100 according to embodiments of the disclosure, a material stack 200 including the conductive material 114' of the source 114, the dielectric 122, the conductive material 112' of the digit line 112, the channel material 106' of the channel region 106, and the drain material 104' of the drain region 104 may be formed as shown in FIG. 2. Each of the materials may be formed over the substrate (not shown), such as in a layer, with the dielectric 122 over the conductive material 114' of the source 114, the conductive material 112' of the digit line 112 over the dielectric 122, the channel material 106' of the channel region 106 over the conductive material 112' of the digit line 112, and the drain material 104' of the drain region 104 over the channel material 106' of the channel region 106. In some embodiments, the material stack 200 is formed over a metal on the substrate. Each of the materials may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art.

Figure 3:
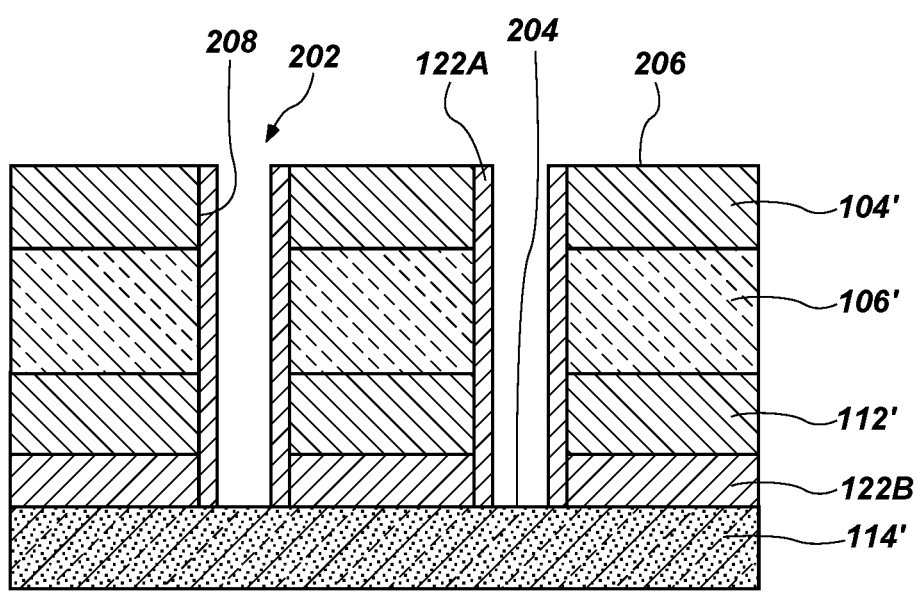

Openings 202 are formed in the materials in a first direction, as shown in FIG. 3, by removing a portion of the materials to expose a top surface 204 of the conductive material 114' of the source 114. The openings 202 are formed by conventional photolithography techniques. Removing the materials forms lines of the material stack 200 separated from one another by the openings 202. The removal of the materials may be accomplished by any suitable technique including, but not limited to, etching, abrasive planarization, or other known methods unless the context indicates otherwise. By way of example only, the openings 202 may be formed by a single etch act or by multiple etch acts using one or more etch chemistries. The openings 202 extend from a top surface 206 of the drain material 104' to the top surface 204 of the conductive material 114' of the source 114, with sidewalls 208 of the openings 202 being substantially vertical.

The first dielectric material 122A is formed in the openings 202 (e.g., on the sidewalls 208 of the material stack 200 and on the exposed top surface 204 of the conductive material 114' of the source 114). The first dielectric material 122A may be conformally formed over the sidewalls 208, such as by ALD. The first dielectric material 122A over the top surface 204 of the conductive material 114' of the source 114 may be removed to expose the top surface 204 of the conductive material 114' of the source 114. The first dielectric material 122A corresponds to the in FIG. 3 dielectric material 122A in FIG. 1B.

Figure 4:
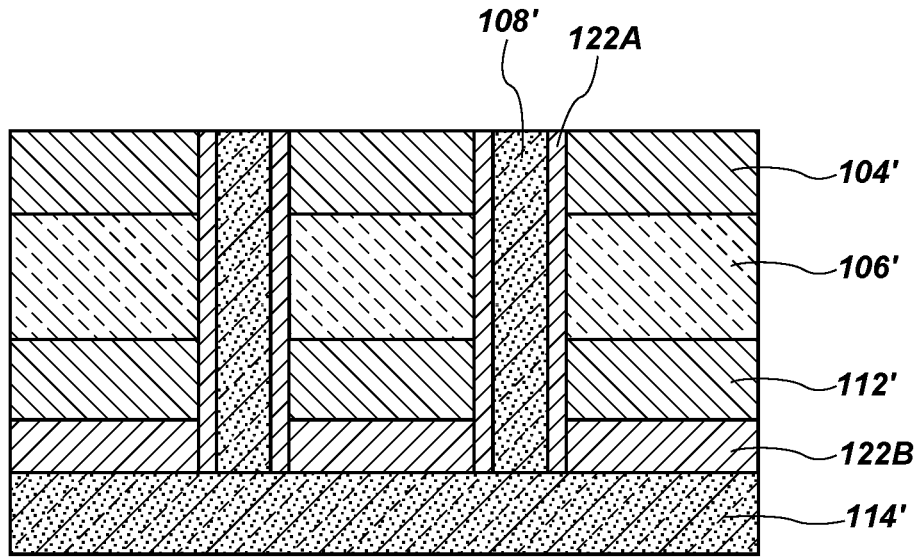
Figure 5:
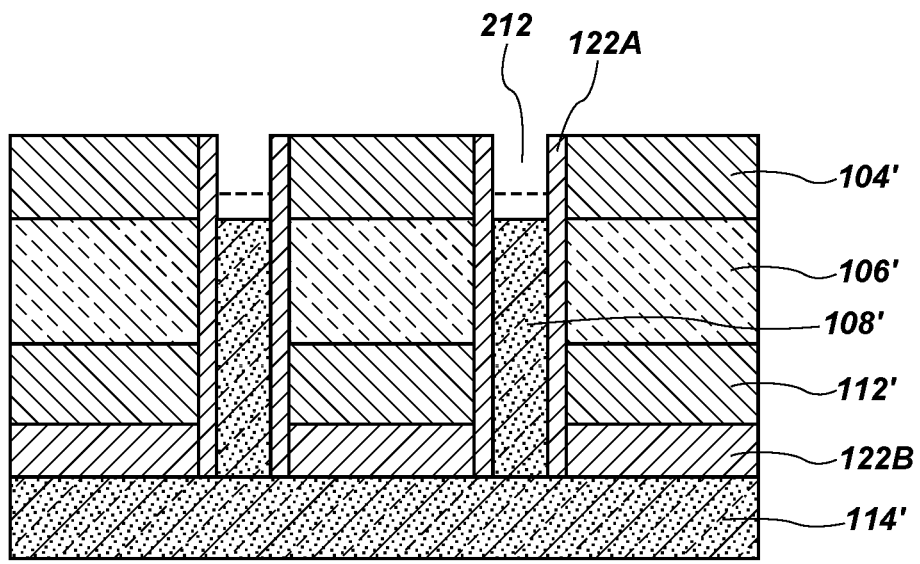
Figure 6:
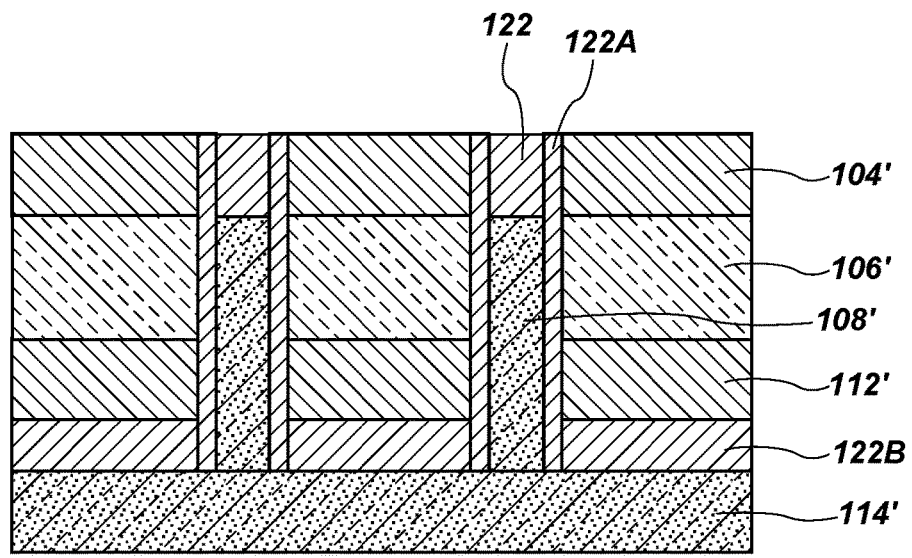

As shown in FIG. 4, the openings 202 are filled with the conductive material 108' of the threshold voltage control gates 108. Any excess conductive material 108' may be removed, such as by abrasive planarization, such that a top surface of the conductive material 108' of the threshold voltage control gates 108 is substantially coplanar with a top surface of the drain material 104' and the first dielectric material 122A. Additional openings (not shown) are formed in the material stack 200 by conventional photolithography techniques and in a second direction perpendicular to the first direction, which openings are filled with the conductive material to form the active control gates 110 by conventional techniques. The threshold voltage control gates 108 and active control gates 110 are, thus, formed perpendicular to one another and separated by the dielectric material of the first dielectric material 122A. A portion of the conductive material 108' of the threshold voltage control gates 108 is removed to form recesses 212, as shown in FIG. 5, such that a top surface 204 of the conductive material 108' of the threshold voltage control gates 108 is substantially coplanar with a top surface of the channel material 106' of the channel region 106. Alternatively, the top surface 204 of the conductive material 108' of the threshold voltage control gates 108 may be elevated relative to the top surface of the channel material 106' of the channel region 106, as indicated in FIG. 5 with dashed lines. The recesses 212 may be filled with the dielectric material 122, as shown in FIG. 6. Any excess dielectric material may be removed, such as by abrasive planarization.

Accordingly, a method of forming a semiconductor device is disclosed. The method comprises forming transistors, where the transistors are formed by forming first openings in a material stack. The material stack comprises a first conductive material, a dielectric material, a second conductive material, a channel material, and a third conductive material. A first dielectric material is formed on sidewalls of the material stack in the first openings and a fourth conductive material is formed in the first openings to fill the first openings. A portion of the fourth conductive material is removed to form recesses. Second openings are formed in the material stack and a fifth conductive material is formed in the second openings to fill the second openings. A second dielectric material is formed in the recesses.

Additional process acts may be conducted to form the semiconductor device including the vertical TFT 100. The additional process acts may be conducted by conventional techniques, which are not described in detail herein.

During use and operation, a voltage is applied to the active control gates 110 while another voltage is applied to the threshold voltage control gates 108, which enables a predetermined $V_t$ of the vertical TFTs 100 to be achieved. The active control gates 110 may be operated conventionally. The $V_t$ of the vertical TFT 100 may be tailored by application of the external bias to the threshold voltage control gates 108, where the predetermined $V_t$ is selected depending on desired electrical characteristics of the semiconductor device including the vertical TFT 100. The $V_t$ of the vertical TFT 100 may, therefore, be modulated without doping the channel region 106 and/or modifying the work function between the active control gates 110 and the channel region 106. The application of the bias to the threshold voltage control gates 108 functions as a so-called "knob" (e.g., an electrical knob) to increase the $V_t$, such as when the oxide semiconductor material is used as the material for the channel region 106. The predetermined $V_t$ may be achieved by application of the external bias to the threshold voltage control gates 108. When polysilicon or silicon is used as the material for the channel region 106, the $V_t$ may be further modified (e.g., increased) by doping the channel region 106 and/or modifying the work function in addition to applying the external bias to the threshold voltage control gates 108. The doping of the channel region 106 and/or modifying the work function remains as an additional knob (e.g., a process-based knob) to modify other electrical characteristics of the vertical TFT 100, such as $I_{on}$ or gate induced drain leakage (GIDL) when polysilicon or silicon is used as the channel material.

During use and operation, the external bias is applied to the threshold voltage control gates 108 through the source 114 at a voltage between about −2.0 V and about 2.0 V, such as between about −2.0 V and about −1.5 V, between about −1.5 V and about −1.0 V, between about −1.0 V and about −0.5 V, between about −0.5 V and about 0 V, between about 0 V and about 0.5 V, between about 0.5 V and about 1.0 V, between about 1.0 V and about 1.5 V, or between about 1.5 V and about 2.0 V. The voltage applied to the threshold voltage control gates 108 is substantially constant. Without being bound by any theory, it is believed that the application of the external bias controls the potential in the channel region 106 and changes (e.g., increases) the $V_t$. Depending on the bias applied to the source 114 and the threshold voltage control gates 108, the predetermined $V_t$ is achieved. For example, during the application of a predetermined external bias (e.g., 2 V), the vertical TFT 100 according to embodiments of the disclosure exhibits a higher $V_t$, lower $I_{off}$, and a higher $I_{on}$ compared to a conventional TFT lacking the threshold voltage control gates. Similarly, at the application of a different predetermined external bias (e.g., −2 V or −0.5 V), the vertical TFT 100 according to embodiments of the disclosure exhibits a higher $V_t$, lower $I_{off}$, and a higher $I_{on}$ compared to a conventional TFT lacking the threshold voltage control gates 108. In contrast, a conventional semiconductor device (lacking the vertical TFT 100 according to embodiments of the disclosure) exhibits a higher current at a given voltage than the semiconductor device containing the vertical TFT 100 according to embodiments of the disclosure. Biasing the threshold voltage control gates 108 may reduce or prevent so-called word line disturb since the active control gates 110 (e.g., word line) of one vertical TFT 100 affect the active control gates 110 of an adjacent vertical transistor when a voltage is applied to the active control gates 110 of the vertical TFT 100.

Accordingly, a method of operating a semiconductor device is disclosed. The method comprises applying a voltage to active control gates of a transistor and applying an external bias to threshold voltage control gates of the transistor. The transistor comprises the active control gates adjacent a channel region, and the threshold voltage control gates adjacent the channel region. The threshold voltage control gates are separated from the active control gates by a dielectric material.

The vertical TFTs 100 according to embodiments of the disclosure may be incorporated in semiconductor devices, such as memory structures (e.g., memory cells). The active control gates 110 of the vertical TFTs 100 may interconnect along rows of the memory cells and form the access lines. The digit line 112 (e.g., data/sense line) may interconnect with one of the source/drains regions 102, 104 of each vertical TFT 100 along columns of the memory cells. The data/sense line (e.g., digit line 112) may connect with individual sense amplifiers (not shown) outside of the memory array. In the memory cells, a storage element may be in operative communication with the at least one vertical TFT 100. Different configurations of storage elements are contemplated as known by those of ordinary skill in the art. For example, storage elements (e.g., capacitors) may be configured as container structures, planar structures, etc. The vertical TFT 100 enables a read and/or write operation of a charge stored in the storage element.

Figure 7:
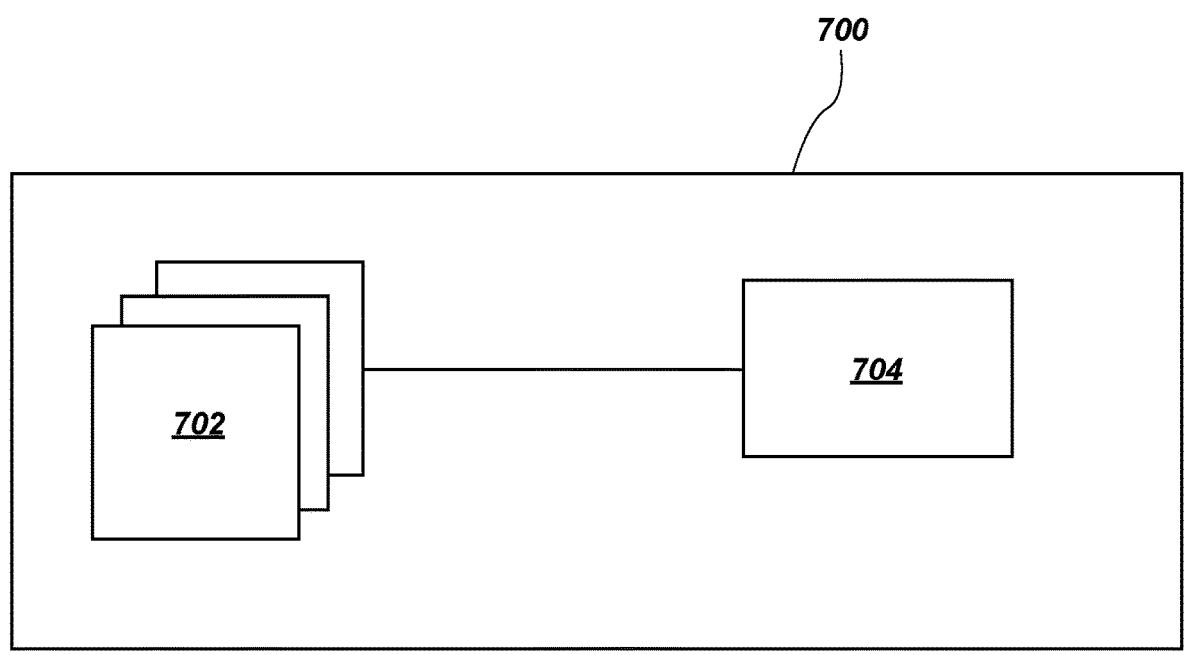
FIG. 7 is a functional block diagram of a memory device including a memory array comprising transistors in accordance with embodiments of the disclosure.

FIG. 7 illustrates a simplified block diagram of a memory device 700 in accordance with embodiments of the disclosure. The memory device 700 includes at least one memory cell having at least one vertical TFT 100 according to embodiments of the disclosure, as described above, in operative communication with the storage element. The vertical TFT 100 may act as a switch for enabling and disabling current flow through the memory cell. By way of non-limiting example, the vertical TFT 100 may include the active control gates 110 and the threshold voltage control gates 108 as described above. The memory device 700 includes a memory array 702 comprising the memory cells and a control logic component 704. The memory array 702 may include multiple memory cells including the at least one vertical TFT 100 according to embodiments of the disclosure. The control logic component 704 may be configured to operatively interact with the memory array 702 so as to read, write, or re-fresh any or all memory cells within the memory array 702.

Accordingly, a semiconductor device comprising memory cells where at least one of the memory cells comprises at least one vertical TFT and a storage element in operative communication with the at least one vertical TFT is disclosed. The at least one vertical TFT comprises active control gates adjacent a channel region, threshold voltage control gates adjacent the channel region and separated from the active control gates by a first dielectric material, and a second dielectric material between the threshold voltage control gates and the channel region.

The vertical TFT 100 may be incorporated in memory structures, memory cells, arrays including the memory cells, memory devices, switching devices, other semiconductor devices including the arrays, and systems including the arrays. Embodiments of the vertical TFT 100 may be used in a variety of different memory cells (e.g., volatile memory, non-volatile memory) and/or transistor configurations. Non-limiting examples include random-access memory (RAM), read-only memory (ROM), dynamic random access memory (DRAM), synchronous dynamic random access memory (SDRAW flash memory, resistive random access memory (ReRAM), conductive bridge random access memory (conductive bridge RAM), magnetoresistive random access memory (MRAM), phase change material (PCM) memory, phase change random access memory (PCRAIVI), spin-torque-transfer random access memory (STTRAM), oxygen vacancy-based memory, programmable conductor memory, ferroelectric random access memory (FE-RAM), reference field-effect transistors (RE-FET), etc.

Figure 8:
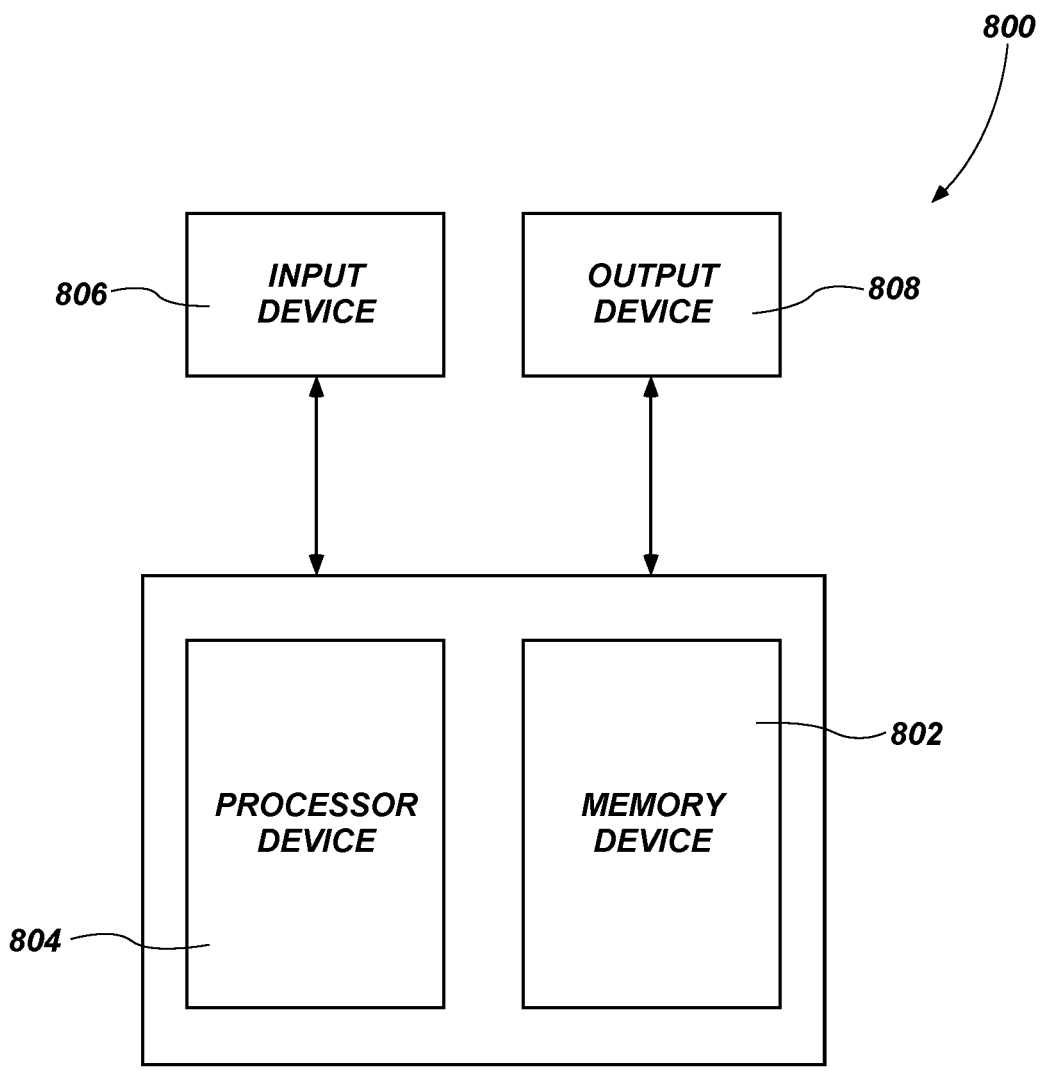
FIG. 8 is a schematic block diagram illustrating an electronic system including semiconductor devices comprising at least one transistor in accordance with embodiments of the disclosure.

Semiconductor devices including the vertical TFTs 100 formed in accordance with embodiments of the disclosure may be formed by conducting additional process acts, which are not described in detail herein. The semiconductor devices may be used in an electronic system 800 as shown in FIG. 8. The electronic system 800 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 800 includes at least one memory device 802, which includes at least one semiconductor device including memory cells having at least one vertical TFT 100 as previously described. The at least one memory device 802 may include, for example, the vertical TFTs 100 as previously described. The electronic system 800 may further include at least one electronic signal processor device 804 (often referred to as a "microprocessor"). The electronic signal processor device 804 may, optionally, include at least one vertical TFT 100 as previously described. The electronic system 800 may further include one or more input devices 806 for inputting information into the electronic system 800 by a user, such as, for example, a mouse or other pointing device, a keyboard, a touchpad, a button, or a control panel. The electronic system 800 may further include one or more output devices 808 for outputting information (e.g., visual or audio output) to a user such as, for example, a monitor, a display, a printer, an audio output jack, a speaker, etc. In some embodiments, the input device 806 and the output device 808 may comprise a single touchscreen device that can be used both to input information to the electronic system 800 and to output visual information to a user. The one or more input devices 806 and output devices 808 may communicate electrically with at least one of the memory device 802 and the electronic signal processor device 804.

Accordingly, a system comprising memory cells comprising at least one vertical TFT and a storage element in operative communication with the at least one vertical TFT is disclosed. The at least one vertical TFT comprises active control gates adjacent a channel region, threshold voltage control gates adjacent the channel region and configured to receive an external bias to control a threshold voltage of the at least one vertical TFT, and a dielectric material between the threshold voltage control gates and the channel region.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A transistor comprising:
   active control gates adjacent to opposing first sides of a channel region, wherein a length of the active control gates is less than a length of the channel region;
   threshold voltage control gates laterally adjacent to opposing second sides of the channel region, the threshold voltage control gates at an elevational level of the active control gates;
   a dielectric region between the threshold voltage control gates and the channel region and between the active control gates and the channel region; and
   a digit line in electrical communication with the channel region, wherein the threshold voltage control gates are laterally adjacent to opposing sides of the digit line at an elevational level of the digit line.

2. The transistor of claim 1, wherein the threshold voltage control gates comprise a pair of threshold voltage control gates and one threshold voltage control gate of the pair is laterally adjacent to a first sidewall of the channel region and the other threshold voltage control gate of the pair is laterally adjacent to a second sidewall of the channel region.

3. The transistor of claim 1, wherein the threshold voltage control gates are configured to receive an external bias to control a threshold voltage of the transistor.

4. The transistor of claim 1, wherein the active control gates comprise a pair of active control gates and one active control gate of the pair is laterally adjacent to a front surface of the channel region and the other active control gate of the pair is laterally adjacent to a back surface of the channel region.

5. The transistor of claim 1, wherein the threshold voltage control gates and the active control gates substantially surround the first sides and the second sides of the channel region.

6. The transistor of claim 5, wherein the dielectric region separates the threshold voltage control gates and the active control gates from the channel region.

7. The transistor of claim 1, wherein the dielectric region is the only material between laterally adjacent sidewalls of the threshold voltage control gates and the channel region.

8. The transistor of claim 1, further comprising a source in electrical communication with the threshold voltage control gates.

9. The transistor of claim 8, wherein the source is configured to apply an external bias to the threshold voltage control gates.

10. The transistor of claim 1, wherein the digit line is below the channel region.

11. The transistor of claim 1, wherein the transistor is configured in a vertical orientation.

12. The transistor of claim 1, wherein the threshold voltage control gates are oriented perpendicular to the active control gates.

13. A semiconductor device, comprising:
    memory cells, at least one memory cell of the memory cells comprising at least one vertical thin film transistor comprising:
      active control gates adjacent to a channel region;
      threshold voltage control gates adjacent to the channel region, the threshold voltage control gates and the active control gates surrounding sidewalls of the channel region, the active control gates having a length in a vertical direction that is less than a length of the threshold voltage control gates in the vertical direction, and the threshold voltage control gates separated from the active control gates by elongated portions of a first dielectric region extending in the vertical direction;
      a second dielectric region between the threshold voltage control gates and the channel region;
      a storage element in operative communication with the at least one vertical thin film transistor; and
      a digit line in electrical communication with the channel region, wherein elongated portions of the second dielectric region extend in the vertical direction directly between the threshold voltage control gates and the digit line.

14. The semiconductor device of claim 13, further comprising a third dielectric region between the active control gates and the channel region.

15. The semiconductor device of claim 14, further comprising a source in direct contact with the threshold voltage control gates.

16. The semiconductor device of claim 15, further comprising a fourth dielectric region between the source and the channel region.

17. The semiconductor device of claim 13, wherein the at least one memory cell of the memory cells comprises at least two vertical thin film transistors and wherein the threshold voltage control gates are shared between adjacent vertical thin film transistors of the at least two vertical thin film transistors.

18. A system comprising:
    memory cells comprising at least one vertical thin film transistor and a storage element in operative communication with the at least one vertical thin film transistor, the at least one vertical thin film transistor comprising:
      active control gates adjacent to a channel region;
      threshold voltage control gates adjacent to the channel region, the threshold voltage control gates and the active control gates comprising discrete portions that, in combination, substantially surround the channel region along a vertical extent of the active control gates, the active control gates vertically overlapping a portion of the threshold voltage control gates, top surfaces of the threshold voltage control gates substantially coplanar with a top surface of the channel region, and the threshold voltage control gates configured to receive an external bias to control a threshold voltage of the least one vertical thin film transistor; and a dielectric material between the threshold voltage control gates and the channel region.

* * * * *